US010670685B2

(12) United States Patent
Teboulle et al.

(10) Patent No.: US 10,670,685 B2
(45) Date of Patent: Jun. 2, 2020

(54) METHOD FOR DETECTING A FAULT IN AN ELECTRICITY METER INCLUDING A BREAKING UNIT

(71) Applicant: SAGEMCOM ENERGY & TELECOM SAS, Rueil-Malmaison (FR)

(72) Inventors: Henri Teboulle, Rueil-Malmaison (FR); Christophe Grincourt, Rueil-Malmaison (FR)

(73) Assignee: SAGEMCOM ENERGY & TELECOM SAS, Rueil Malmaison (FR)

(*) Notice: Subject to any disclaimer, the term of this patent is extended or adjusted under 35 U.S.C. 154(b) by 117 days.

(21) Appl. No.: 16/091,408

(22) PCT Filed: Apr. 7, 2017

(86) PCT No.: PCT/EP2017/058458
§ 371 (c)(1),
(2) Date: Oct. 4, 2018

(87) PCT Pub. No.: WO2017/178388
PCT Pub. Date: Oct. 19, 2017

(65) Prior Publication Data
US 2019/0154786 A1   May 23, 2019

(30) Foreign Application Priority Data

Apr. 12, 2016   (FR) ..................... 16 53232

(51) Int. Cl.
G01R 35/04   (2006.01)
G01K 1/14   (2006.01)
(Continued)

(52) U.S. Cl.
CPC ............... *G01R 35/04* (2013.01); *G01K 1/14* (2013.01); *G01R 11/25* (2013.01); *G01R 22/068* (2013.01)

(58) Field of Classification Search
CPC ...... G01R 35/04; G01R 11/25; G01R 22/068; G01R 22/066; G01K 1/14; G01D 2/08
See application file for complete search history.

(56) References Cited

U.S. PATENT DOCUMENTS 3,958,178 A * 5/1976 Mueller ................. G01R 15/09
324/115
4,351,028 A * 9/1982 Peddie .................... G07F 7/025
700/286

(Continued)

FOREIGN PATENT DOCUMENTS

WO   WO 2010/149921 A1   12/2010

*Primary Examiner* — Jermele M Hollington
*Assistant Examiner* — Taqi R Nasir
(74) *Attorney, Agent, or Firm* — Muncy, Geissler, Olds & Lowe, P.C.

(57) ABSTRACT

Method for detecting a fault in an electricity meter including a breaking unit, the fault producing an abnormal temperature increase in the meter, the detecting method comprising the steps of:
    measuring a magnitude of an electrical current flowing through the breaking unit;
    measuring an interior temperature in proximity to the breaking unit; and
    detecting the presence or absence of the fault on the basis of the measured magnitude and the measured interior temperature.

20 Claims, 2 Drawing Sheets

(51) Int. Cl.
*G01R 11/25* (2006.01)
*G01R 22/06* (2006.01)

(56) References Cited

U.S. PATENT DOCUMENTS

| | | | | | |
|---|---|---|---|---|---|
| 4,415,896 | A | * | 11/1983 | Allgood | G01F 1/684 340/870.03 |
| 6,067,029 | A | * | 5/2000 | Durston | H04Q 9/00 324/76.11 |
| 7,176,673 | B2 | * | 2/2007 | Tsubota | H02H 3/33 324/127 |
| 8,878,517 | B2 | * | 11/2014 | Banhegyesi | G01R 22/10 324/74 |
| 2014/0327449 | A1 | * | 11/2014 | Shuey | G01R 31/50 324/538 |
| 2015/0070507 | A1 | * | 3/2015 | Kagan | G01D 4/002 348/160 |
| 2015/0233731 | A1 | | 8/2015 | Torpy et al. | |
| 2015/0377949 | A1 | * | 12/2015 | Ramirez | G01R 22/068 361/103 |

* cited by examiner

| I (A) | δθa (°C) | δθp (°C) | δθda (°C) |
|---|---|---|---|
| 1 | 0.3 | 0.42 | 0.6 |
| 2 | 0.6 | 0.84 | 1.2 |
| 3 | 0.9 | 1.26 | 1.8 |
| 4 | 1.2 | 1.68 | 2.4 |
| 5 | 1.5 | 2.1 | 3 |
| 6 | 1.8 | 2.52 | 3.6 |
| 7 | 2.1 | 2.94 | 4.2 |
| 8 | 2.4 | 3.36 | 4.8 |
| 9 | 2.7 | 3.78 | 5.4 |
| 10 | 3 | 4.2 | 6 |
| 11 | 3.3 | 4.62 | 6.6 |
| 12 | 3.6 | 5.04 | 7.2 |
| 13 | 3.9 | 5.46 | 7.8 |
| 14 | 4.2 | 5.88 | 8.4 |
| 15 | 4.5 | 6.3 | 9 |
| 16 | 4.8 | 6.72 | 9.6 |
| 17 | 5.1 | 7.14 | 10.2 |
| 18 | 5.4 | 7.56 | 10.8 |
| 19 | 5.7 | 7.98 | 11.4 |
| 20 | 6 | 8.4 | 12 |
| 21 | 6.3 | 8.82 | 12.6 |
| 22 | 6.6 | 9.24 | 13.2 |
| 23 | 6.9 | 9.66 | 13.8 |
| 24 | 7.2 | 10.08 | 14.4 |
| 25 | 7.5 | 10.5 | 15 |
| 26 | 7.8 | 10.92 | 15.6 |
| 27 | 8.1 | 11.34 | 16.2 |
| 28 | 8.4 | 11.76 | 16.8 |
| 29 | 8.7 | 12.18 | 17.4 |
| 30 | 9 | 12.6 | 18 |
| 31 | 9.3 | 13.02 | 18.6 |
| 32 | 9.6 | 13.44 | 19.2 |
| 33 | 9.9 | 13.86 | 19.8 |
| 34 | 10.2 | 14.28 | 20.4 |
| 35 | 10.5 | 14.7 | 21 |
| 36 | 10.8 | 15.12 | 21.6 |
| 37 | 11.1 | 15.54 | 22.2 |
| 38 | 11.4 | 15.96 | 22.8 |
| 39 | 11.7 | 16.38 | 23.4 |
| 40 | 12 | 16.8 | 24 |
| 41 | 12.3 | 17.22 | 24.6 |
| 42 | 12.6 | 17.64 | 25.2 |
| 43 | 12.9 | 18.06 | 25.8 |
| 44 | 13.2 | 18.48 | 26.4 |
| 45 | 13.5 | 18.9 | 27 |
| 46 | 13.8 | 19.32 | 27.6 |
| 47 | 14.1 | 19.74 | 28.2 |
| 48 | 14.4 | 20.16 | 28.8 |
| 49 | 14.7 | 20.58 | 29.4 |
| 50 | 15 | 21 | 30 |
| 51 | 15.3 | 21.42 | 30.6 |
| 52 | 15.6 | 21.84 | 31.2 |
| 53 | 15.9 | 22.26 | 31.8 |
| 54 | 16.2 | 22.68 | 32.4 |
| 55 | 16.5 | 23.1 | 33 |
| 56 | 16.8 | 23.52 | 33.6 |
| 57 | 17.1 | 23.94 | 34.2 |
| 58 | 17.4 | 24.36 | 34.8 |
| 59 | 17.7 | 24.78 | 35.4 |
| 60 | 18 | 25.2 | 36 |
| 61 | 18.3 | 25.62 | 36.6 |
| 62 | 18.6 | 26.04 | 37.2 |
| 63 | 18.9 | 26.46 | 37.8 |
| 64 | 19.2 | 26.88 | 38.4 |
| 65 | 19.5 | 27.3 | 39 |

Fig. 3

METHOD FOR DETECTING A FAULT IN AN ELECTRICITY METER INCLUDING A BREAKING UNIT

The invention relates to the field of electricity meters.

BACKGROUND OF THE INVENTION

Modern electricity meters are so-called "smart" electronic meters that are naturally suitable for measuring a quantity of electrical energy supplied by a supplier to an electrical installation via a supply network, and which are also capable of performing a certain number of additional functions: managing tariffs on receiving orders; remote reading and programming; remote client information; etc.

Such electricity meters sometimes include a cutoff member that is connected in a live conductor and that makes it possible to act remotely to cause the electrical installation to be selectively connected to or disconnected from the supply network.

The electric current flowing through the cutoff member in such an electricity meter naturally tends to raise the temperature inside the electricity meter. Nevertheless, certain faults that can occur in the electricity meter can lead to abnormal heating of the cutoff member and to an abnormal rise of temperature inside the electricity meter. The abnormal rise of temperature runs the risk of damaging the electricity meter, or even of leading to a fire in the electrical installation starting from the electricity meter.

Document WO-A-2010/149921 proposes detecting abnormal heating of the cutoff member that might lead to such an abnormal temperature rise inside an electricity meter. In that document, the heating comes from an abnormal increase in the internal resistance of the cutoff member as a result of degradation of the surface state of poles of the cutoff member. That document teaches estimating the abnormal increase in the internal resistance by measuring a voltage across the terminals of the internal resistance.

Nevertheless, it should be observed that the internal resistance of a cutoff member is very low, being of the order of 500 microohms ($\mu\Omega$). The internal resistance of the cutoff member may for example double in the event of contact blackening, so as to reach 1 milliohm (m$\Omega$). When an electric current of 10 amps (A) passes through the closed cutoff member, the potential difference across the terminals of the cutoff member goes from 5 millivolts (mV) to 10 mV. It is therefore necessary to be capable of measuring a potential difference of 5 mV, which represents very high metrological precision (the necessary precision is 0.02%, assuming that a voltage sensor used for performing this measurement is also to be capable of measuring the voltage supplied by the mains, i.e. 230 volts (V)). That method is also extremely sensitive to noise. The voltage sensor used must therefore be of very high performance and thus very expensive.

It should also be observed that Document WO-A-2010/149921 is capable only of detecting a temperature rise due to a fault in the cutoff member, and not due to some other cause, e.g. such as a problem of connecting an electric cable to the electricity meter.

OBJECT OF THE INVENTION

An object of the invention is to detect a greater number of potential faults that could raise the temperature inside an electricity meter abnormally, while reducing the cost of detection.

SUMMARY OF THE INVENTION

In order to achieve this object, there is provided a detection method for detecting a fault in an electricity meter that includes a cutoff member, the fault producing an abnormal rise of temperature inside the electricity meter, the detection method comprising the steps of:
   measuring the magnitude of an electric current flowing through the cutoff member;
   measuring an inside temperature in the proximity of the cutoff member; and
   detecting the presence or the absence of a fault from the measured current and the measured inside temperature.

The detection method of the invention can detect a fault that produces an abnormal temperature rise inside the electricity meter without making use of a particularly high performance and expensive voltage sensor. The cost of detection is thus reduced.

The detection method of the invention makes it possible to detect faults specific to the cutoff member: premature aging of the cutoff member as a result of microbreaks due to phenomena such as vibration opening the cutoff member in untimely manner, a risk of the cutoff member being degraded while opening or closing if there is a highly inductive load, the blackening phenomenon that increases internal resistance of the cutoff member, thereby leading to greater heating of the cutoff member for a given electric current passing therethrough, etc.

The detection method of the invention also makes it possible to detect faults outside the cutoff member, and in particular poor clamping of electric cables connected to the meter, which can lead to critical heating inside the meter. Such a fault is not detected by a detection method based solely on measuring the resistance of the cutoff member (and in particular by measuring the voltage across the terminals of the cutoff member).

The invention also provides an electricity meter including a cutoff member, a current sensor for measuring an electric current flowing through the cutoff member when it is closed, an inside temperature sensor positioned in the proximity of the cutoff member, and processor means arranged to perform the detection method as described above.

The invention also provides a computer program comprising instructions enabling an electricity meter to perform the detection method as described above.

The invention also provides storage means, characterized in that they store a computer program comprising instructions enabling an electricity meter to perform the detection method as described above.

The invention can be better understood in the light of the following description of particular non-limiting implementations of the invention.

BRIEF DESCRIPTION OF THE DRAWINGS

Reference is made to the accompanying drawings, in which:

FIG. 3 is a table of current values, and for each current value, of temperature rise thresholds.

DETAILED DESCRIPTION OF THE INVENTION

Figure 1:
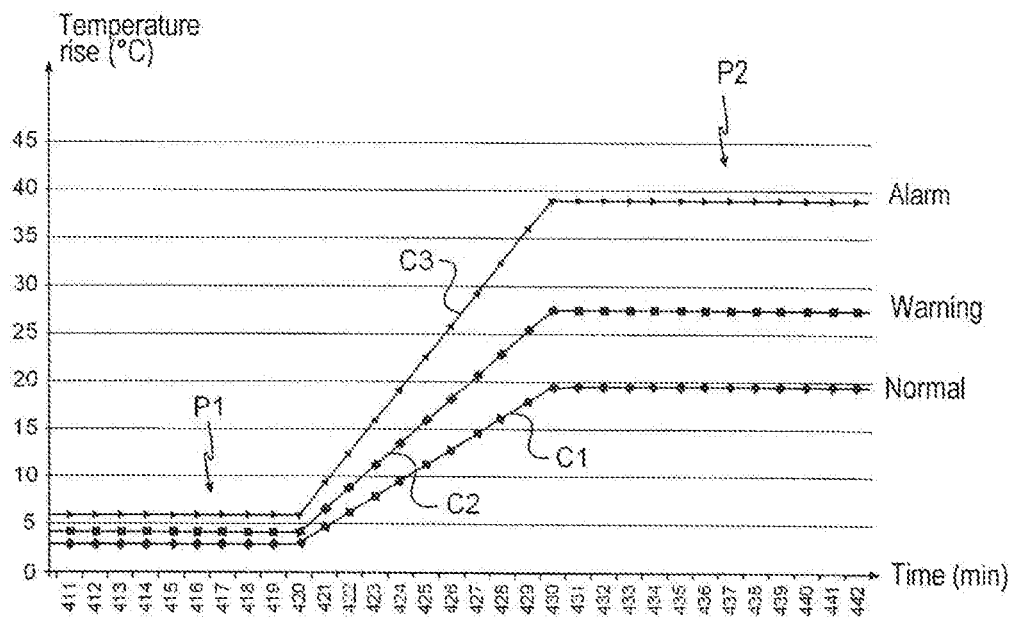
FIG. 1 is a graph plotting temperature rise curves in an electricity meter while the current flowing through the cutoff member of the meter goes from a first plateau at a first current value to a second plateau at a second current value greater than the first.

In a first implementation of the invention, the detection method is performed in an electricity meter.

The meter is for measuring the electrical energy that is supplied by a supply network situated upstream from the meter and that is consumed by an electrical installation situated downstream from the meter.

Supplying electrical energy consists in supplying electricity to the electrical installation at a certain voltage. The electricity flows via a live conductor that has a short portion extending through the meter.

The meter has a cutoff member that is connected in the live conductor inside the meter. The cutoff member makes it possible to act remotely to cause the electrical installation to be selectively connected to and disconnected from the supply network. The internal resistance of the cutoff member is about 500 p$\Omega$ (or about 1.5 m$\Omega$ when taking account of copper bars situated on either side of a moving contact of the cutoff member).

In addition to the cutoff member, the meter includes a current sensor, an inside temperature sensor, and an electronic card including processor means. The processor means comprise a smart processor component (e.g. a microcontroller, a processor, a field programmable gate array (FPGA), etc.) suitable for executing instructions of a program in order to perform the detection method in the first implementation of the invention.

The meter is for measuring the electricity flowing through the cutoff member when the cutoff member is closed. The magnitude of the electric current conventionally lies in the range 1 A to 65 A, even though it can naturally be less than 1 A or greater than 65 A. It should be observed that the current sensor in question is a conventional current sensor for the meter serving to measure the electricity consumption of the electrical installation. The current sensor is therefore not dedicated to performing the detection method of the first implementation of the invention.

The inside temperature sensor is positioned in the proximity of the cutoff member (possibly in contact with the cutoff member) and it serves to measure a temperature inside the meter, in the proximity of the cutoff member. The inside temperature sensor is likewise a conventional temperature sensor. The inside temperature sensor is likewise not dedicated to performing the detection method of the first implementation of the invention.

In this example, it should be observed that the meter used does not include an outside temperature sensor for measuring a temperature outside the meter. The cost of performing the detection method in the first implementation of the invention is therefore reduced compared with the cost of performing a detection method that requires an outside temperature sensor.

The detection method of the first implementation of the invention as performed by the processor means serves to detect a fault that produces an abnormal temperature rise inside the electricity meter. Examples of such faults are mentioned above in the description.

The detection method of the first implementation of the invention consists in measuring the magnitude of the electric current flowing through the cutoff member when the cutoff member is closed, in measuring the inside temperature, and in detecting the presence or the absence of a fault on the basis of the measured current and the measured inside temperature.

Since the meter used in this example does not have an outside temperature sensor, it is difficult to detect an abnormal rise of temperature inside the meter, given that since the inside temperature as measured by the inside temperature sensor depends not only on the heating produced by current flowing through the cutoff member (where such heating is inevitable), but also, naturally, on the outside temperature.

The detection method of the first implementation of the invention thus uses an inside temperature gradient as a function of the magnitude of the electric current flowing through the cutoff member.

The processor means begin by acquiring a first inside temperature (measured by the inside temperature sensor) when the measured current reaches a first plateau at a first magnitude (measured by the current sensor), and it then acquires a second inside temperature (measured by the inside temperature sensor) when the measured current reaches a second plateau at a second magnitude (measured by the current sensor). The second plateau is a plateau that directly follows the first plateau.

In general manner, the plateaus in question relate to the appearance of a curve plotting the electric current consumed by the electrical installation. When one or more appliances in the electrical installation are operating, the curve plotting current reaches a plateau and stabilizes on that plateau. When an additional appliance is activated, the current curve reaches a following plateau and stabilizes on the following plateau.

Each plateau is defined as being a portion of a curve plotting current in which the magnitude of the current remains stable for a predetermined duration.

The term "stable" is used to mean that a maximum difference in absolute value between a current value at any instant during a plateau and a mean current value for the plateau is less than or equal to a predetermined threshold for the plateau. In this example, the first current is the mean current of the first plateau and the second current is the mean current of the second plateau. Thus, a maximum difference in absolute value between a current at any instant during the first plateau and the first current is less than or equal to a first predetermined plateau threshold, and a maximum difference in absolute value between a current at any instant during the second plateau and the second current is less than or equal to a second predetermined plateau threshold.

The first predetermined plateau threshold advantageously lies in the range 5% to 25% of the first current and the second predetermined plateau threshold advantageously lies in the range 5% to 25% of the second current. In this example, the first predetermined plateau threshold is equal to 15% of the first current and the second predetermined plateau threshold is equal to 15% of the second current (but the first predetermined plateau threshold and the second predetermined plateau threshold could be different).

In this example, the predetermined duration corresponds to 10 minutes (min) of the measured current integrated over non-moving periods of 1 min.

The first current and/or the second current (i.e. at least one of them) needs to be greater than or equal to a predetermined current threshold before the first current and the second current can be taken into account for performing the detection method of the first implementation of the invention.

Specifically, if the current has a low value, the heating of the cutoff member caused by such a current presents no risk of damaging the meter or of fire for the electrical installation, and the detection method is not performed. Thus, if neither the first current nor the second current is greater than or equal to the predetermined current threshold, then the first current and the second current are not taken into account.

It is the absolute value of current that is taken into consideration herein: specifically it is considered that the current flowing through the cutoff member when it is closed presents a sign that is constant representative of the current flow powering the electrical installation (and not produced by the electrical installation). If the sign of the current is negative (in order to satisfy some standard), then it is the absolute value of the current that is taken into account.

The predetermined current threshold advantageously lies in the range 1 A to 10 A. In this example, the predetermined current threshold is equal to 5 A.

The difference in absolute value between the second current and the first current must also be greater than or equal to a predetermined current difference threshold. Specifically, if the first current and the second current are too close together, then the current difference does not produce any significant difference in the heating of the cutoff member. The first current and the second current then do not enable the detection method to be performed in effective manner and they are not taken into account.

The predetermined current difference threshold advantageously lies in the range 5 A to 15 A. In this example, the predetermined current difference threshold is equal to 9 A.

The detection method then consists in acquiring a first inside temperature in the proximity of the cutoff member while the measured current is at the first plateau at the first current value and in acquiring a second inside temperature in the proximity of the cutoff member when the measured current is at the second plateau at the second current value.

Finally, the detection method consists in detecting the presence or the absence of a fault on the basis of the ratio of the difference between the second inside temperature and the first inside temperature divided by the difference between the second current and the first current.

A potential fault is detected when the ratio is greater than or equal to a predetermined potential fault threshold. The predetermined potential fault threshold advantageously lies in the range 0.2 degrees Celsius per amp (° C./A) to 0.8° C./A. In this example, the predetermined potential fault threshold is equal to 0.4° C./A.

A confirmed fault is detected when the ratio is greater than or equal to a predetermined confirmed fault threshold that is greater than the potential fault threshold. The predetermined confirmed fault threshold advantageously lies in the range 0.2° C./A to 0.8° C./A. In this example, the predetermined confirmed fault threshold is equal to 0.6° C./A.

When the processor means detect a potential fault, the processor means send a warning message to a computer system of the electricity supplier (or of the network manager). The electricity supplier (or the network manager) might then decide to cause the cutoff member to open by sending an open command. Opening the cutoff member serves to reduce the current flowing through the cutoff member to zero and thus to reduce very greatly or even completely the heating of the cutoff member and therefore the risk of fire.

The warning message and the open command are transmitted in bidirectional manner using device language message specification/companion specification for energy metering (DLMS/COSEM).

When the processor means detect a confirmed fault, the processor means send an alarm message to the computer system of the electricity supplier (or of the network manager). The electricity supplier (or the network manager) then decides to cause the cutoff member to open by sending an open command. The alarm message and the open command are transmitted in bidirectional manner using DLMS/COSEM messages.

An example of an alarm message is set out below:

```
<EventNotificationRequest>
    <AttributeDescriptor>
        <ClassId Value=«0001» />
        <InstanceId Value=«0000616200FF» />
        <AttributeId Value=«02» />
    </AttributeDescriptor>
    <AttributeValue>
        <DoubleLongUnsigned Value=«00000001» />
    </AttributeValue>
</EventNotificationRequest>.
```

Encoding associated with the alarm message is: C20000010000616200FF020600000001.

The detection method in the first implementation of the invention is illustrated with reference to FIG. 1.

A first temperature rise curve C1, a second temperature rise curve C2, and a third temperature rise curve C3 are plotted in FIG. 1.

These temperature rise curves correspond to a situation in which the first current I1 at the first plateau P1 is equal to 10 A (i.e. greater than the predetermined current threshold of 5 A), the second current I2 at the second plateau P2 is equal to 65 A (i.e. greater than the predetermined current threshold of 5 A). The second current I2 at the second plateau P2 is thus greater than the first current I1 at the first plateau P1. The difference between the second current I2 and the first current I1 is equal to 55 A and is therefore greater, in absolute value, than the predetermined current difference threshold, which is equal to 9 A.

A maximum difference in absolute value between a current at any instant during the first plateau P1 and the first current I1 is less than or equal to 15% of the first current I1 (i.e. less than or equal to the first predetermined plateau threshold). A maximum difference in absolute value between a current at any instant during the second plateau P2 and the second current I2 is less than or equal to 15% of the second current I2 (i.e. less than or equal to the predetermined second plateau threshold).

The detection method can thus be performed with the first plateau P1 and the second plateau P2 as shown herein.

The first temperature rise curve P1 corresponds to a situation in which the temperature rise of the first plateau P1 is equal to 3.0° C. and the temperature rise of the second plateau P2 is equal to 19.5° C. Naturally, since the temperature outside the meter is not accessible for the processor means, the processor means do not, in reality, have the temperature rise values available. Nevertheless, since variations in outside temperature are negligible compared with the accumulated duration of the first plateau P1, of the second plateau P2, and of the transition between the first plateau P1 and the second plateau P2, the difference between the second inside temperature T2 and the first inside temperature T1 is equal to the difference between the temperature rise of the second plateau P2 and the temperature rise of the first plateau P1.

The ratio of the difference between the second inside temperature T2 and the first inside temperature T1 (as measured by the inside temperature sensor) divided by the difference between the second current I2 and the first current I1 (as measured by the current sensor) thus corresponds to an inside temperature gradient as a function of the current, and also, as explained above, to a temperature rise gradient in the meter as a function of the magnitude of the electric current.

For the first temperature rise curve C1, the ratio Grad1 of the difference between the second inside temperature T2 and the third inside temperature T1 divided by the difference between the second current I2 and the first current I1 is given by:

$$Grad1=(T2-T1)/(I2-I1)=0.30$$

The ratio Grad1 is thus less than the potential fault threshold (in this example equal to 0.4° C./A), and is therefore naturally less than the confirmed fault threshold (equal in this example to 0.6° C./A): the processor means do not detect any fault.

The second temperature rise curve C2 corresponds to a situation in which the temperature rise of the first plateau P1 is equal to 4.2° C. and the temperature rise of the second plateau P2 is equal to 27.3° C.

For the second temperature rise curve C2, the ratio Grad2 of the difference between the second inside temperature T2 and the first inside temperature T1 divided by the difference between the second current I2 and the first current I1 is given by:

$$Grad2=(T2-T1)/(I2-I1)=0.42$$

The ratio Grad2 is thus greater than the predetermined potential fault threshold (equal in this example to 0.4° C./A) and less than the predetermined confirmed fault threshold (equal in this example to 0.6° C./A): the processor means detect a potential fault. A warning message is sent by the processor means.

The third temperature rise curve C3 corresponds to a situation in which the temperature rise of the first plateau P1 is equal to 6.0° C. and the temperature rise of the second plateau P2 is equal to 39.0° C.

For the third temperature rise curve C3, the ratio Grad3 of the difference between the second inside temperature T2 and the first inside temperature T1 divided by the difference between the second current I2 and the first current I1 is given by:

$$Grad3=(T2-T1)/(I2-I1)=0.60$$

The ratio Grad3 is thus equal to the predetermined confirmed fault threshold (equal in this example to 0.6° C./A): the processor means detect a confirmed fault. An alarm message is sent by the processor means.

Figure 2:
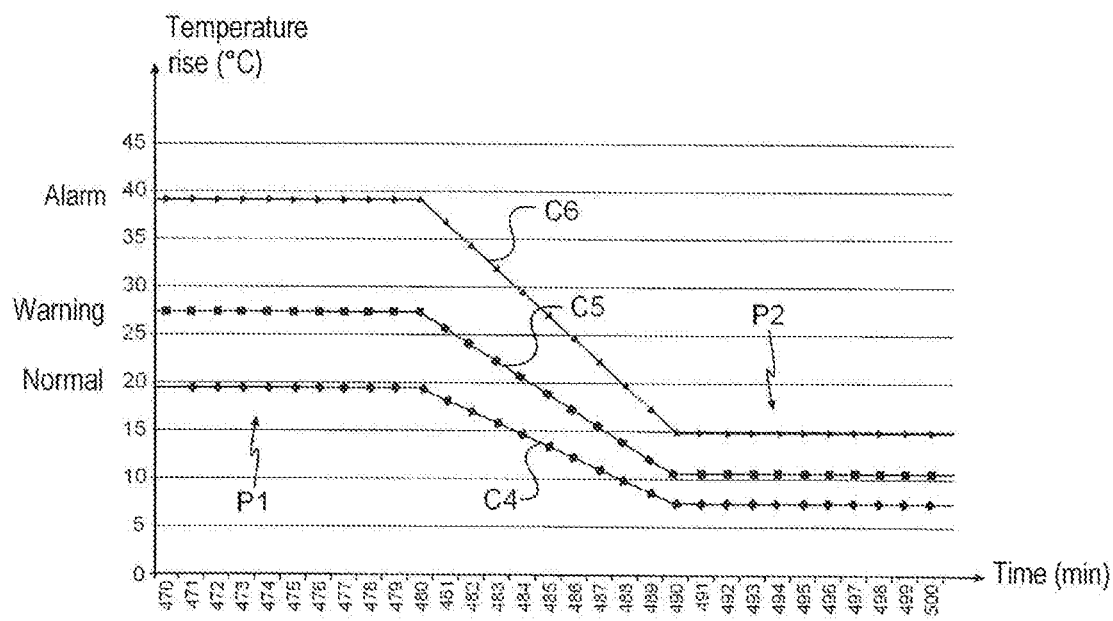
FIG. 2 is analogous to FIG. 1 in which the second current value is less than the first current value.

There follows an illustration of the detection method of the first implementation of the invention given with reference to FIG. 2.

A fourth temperature rise curve C4, a fifth temperature rise curve C5, and a sixth temperature rise curve C6 are plotted in FIG. 2.

These temperature rise curves correspond to a situation in which the first current I1 at the first plateau P1 is equal to 65 A (i.e. greater than the predetermined current threshold of 5 A), the second current I2 at the second plateau P2 is equal to 25 A (i.e. greater than the predetermined current threshold of 5 A). The second current I2 at the second plateau P2 is thus less than the first current I1 at the first plateau P1. The difference between the second current I2 and the first current I1 is equal to −40 A, and is therefore greater, in absolute value, than the predetermined current difference threshold, which is equal to 9 A.

A maximum difference in absolute value between a current at any instant during the first plateau P1 and the first current I1 is less than or equal to 15% of the first current I1 (i.e. less than or equal to the first predetermined plateau threshold). A maximum difference in absolute value between a current at any instant during the second plateau P2 and the second current I1 is less than or equal to 15% of the second current I2 (i.e. less than or equal to the second predetermined plateau threshold).

The detection method can thus be performed with the first plateau P1 and the second plateau P2 as shown.

The fourth temperature rise curve C4 corresponds to a situation in which the temperature rise of the first plateau P1 is equal to 19.5° C. and the temperature rise of the second plateau P2 is equal to 7.5° C.

For the fourth temperature rise curve C4, the ratio Grad4 of the difference between the second inside temperature T2 and the first inside temperature T1 divided by the difference between the second current I2 and the first current I1 is given by:

$$Grad4=(T2-T1)/(I2-I1)=0.30$$

The ratio Grad4 is thus less than the predetermined potential fault threshold (equal in this example to 0.4° C./A), and thus naturally less than the predetermined confirmed fault threshold (equal in this example to 0.6° C./A): the processor means do not detect any fault.

The fifth temperature rise curve C5 corresponds to a situation in which the temperature rise of the first plateau P1 is equal to 27.3° C. and the temperature rise of the second plateau P2 is equal to 10.5° C.

For the fifth temperature rise curve C5, the ratio Grad5 of the difference between the second inside temperature T2 and the first inside temperature T1 divided by the difference between the second current I2 and the first current I1 is given by:

$$Grad5=(T2-T1)/(I2-I1)=0.42$$

The ratio Grad5 is thus greater than the predetermined potential fault threshold (equal in this example to 0.4° C./A), and less than the predetermined confirmed fault threshold (equal in this example to 0.6° C./A): the processor means detect a potential fault. A warning message is sent by the processor means.

The sixth temperature rise curve C6 corresponds to a situation in which the temperature rise of the first plateau P1 is equal to 39.0° C. and the temperature rise of the second plateau P2 is equal to 15.0° C.

For the sixth temperature rise curve C6, the ratio Grad6 of the difference between the second inside temperature T2 and the first inside temperature T1 divided by the difference between the second current I2 and the first current I1 is given by:

$$Grad3=(T2-T1)/(I2-I1)=0.60$$

The ratio Grad2 is thus equal to the predetermined confirmed fault threshold (equal in this example to 0.6° C./A): the processor means detect a confirmed fault. An alarm message is sent by the processor means.

It should be observed at this point that the predetermined potential fault threshold and the predetermined confirmed fault threshold that are used are the same both when the first current is greater than the second current and also when the second current is greater than the first current.

It should also be observed that the ratios Grad1, Grad2, and Grad3 are equal respectively to the ratios Grad4, Grad5, and Grad6, and that this applies even though the second current in FIG. 2 is not equal to the first current in FIG. 1. The expected ratios thus depend solely on the fault situation in the meter (no fault, potential fault, confirmed fault) and not on the magnitude of the electric current being consumed by the electrical installation.

Advantageously, the current measured between the first plateau P1 and the second plateau P2 is filtered by a first lowpass digital filter if the second current I2 is greater than the first current I1, and by a second lowpass digital filter if the second current I2 is less than the first current I1.

The first lowpass digital filter is a first order filter having a cutoff frequency fc1 that is low, being equal in this example to $10^{-2}$ hertz (Hz).

An example of such a first order lowpass digital filter is a filter having the following Z transfer function, assuming that the sampling frequency is 0.1 Hz:

$$H(Z)=(1+Z^{-1})/(1-a \cdot Z^{-1})$$

This filter produces a digital output $S_n$ from a digital input $E_n$ as follows:

$$S_n=E_n+E_{n-1}+a \cdot S_{n-1}$$

with a=0.5095254495.

The second lowpass digital filter is a first order filter similar to the first lowpass filter with a cutoff frequency fc2 greater than fc1, and equal to 2☐fc1 in this example, i.e. equal to 2☐$10^{-2}$ Hz. Under such circumstances, a=0.153844403.

This serves to retard a rise in current compared with a fall in current. This compensates for thermal inertial effects that, for a given difference between the first current I1 and the second current I2, have the consequence of temperature rising more quickly when current rises between the first current I1 and the second current I2 than it decreases when the current decreases from the first current I1 to the second current I2.

Independently of the above description, provision is also made to send a priority warning message when the inside temperature of the meter exceeds a priority warning temperature threshold that is dependent on the measured current, and to send a priority alarm message when the inside temperature exceeds a priority alarm temperature threshold that depends on the measured current.

The priority warning message and the priority alarm message are sent under all circumstances and with priority over the above-mentioned criteria relating to the ratio of the difference between the second temperature and the first temperature divided by the difference between the second current and the first current.

The priority warning message and the priority alarm message constitute additional precautions making it possible for the cutoff member to be caused to open very quickly when heating is very high and needs to be reduced urgently.

The detection method in a second implementation of the invention is performed in a meter similar to the above-described meter but that also includes, in addition to the inside temperature sensor, an outside temperature sensor that measures the temperature outside the meter.

The detection method in the second implementation of the invention consists initially at any given moment in measuring the current flowing through the cutoff member while the cutoff member is closed, in measuring the temperature inside the meter, and in measuring the temperature outside the meter.

The processor means then calculate a temperature rise equal to the difference between the inside temperature and the outside temperature.

Thereafter, the processor means access a Table T, as shown in FIG. 3, which table is stored in a memory of the processor means.

The Table T comprises current values I(A) (in the range 1 A to 65 A with a step of 1 A) and, for each current value I(A), an expected temperature rise δθa, a temperature rise threshold representative of a potential fault δθdp, and a temperature rise threshold representative of a confirmed fault δθda. The expected temperature rise δθa, the temperature rise threshold representative of a potential fault δθdp, and the temperature rise threshold representative of a confirmed fault δθda are predetermined values that depend on the current value I(A) with which they are associated.

The processor means compare the current calculated temperature rise with the expected temperature rise δθa, the temperature rise threshold representative of a potential fault δθdp, and the temperature rise threshold representative of a confirmed fault δθda in the Table T that are associated with the measured current, and they thus detect either the absence of a fault, or a potential fault, or a confirmed fault.

By way of example, if the current sensor measures a current of 28 A, and the temperature rise is close to 8.4° C. (i.e. the value δθa expected for the current value I(A)=28 A in Table T), then the processor means detect no fault. If the temperature rise is greater than or equal to 11.76° C. (i.e. the value of δθdp for the current value I(A)=28 A in Table T), then the processor means detect a potential fault and send a warning message. If the temperature rise is greater than or equal to 16.8° C. (i.e. the value of δθda for the current value I(A)=28 A in Table T), then the processor means detect a confirmed fault and send an alarm message.

Naturally, the invention is not limited to the implementations described but covers any variant coming within the ambit of the invention as defined by the claims.

Although in the detection method of the first implementation of the invention makes use of a predetermined potential fault threshold and a predetermined confirmed fault threshold, it would be entirely possible to use a single predetermined fault threshold (likewise advantageously lying in the range 0.2° C./A to 0.8° C./A) and to detect a fault when the ratio of the temperatures divided by the current is greater than or equal to the predetermined fault threshold.

Likewise, although the detection method of the second implementation of the invention uses a temperature rise threshold representative of a potential fault and a temperature rise threshold representative of a confirmed fault, it would be possible to use a single predetermined temperature rise threshold that depends on the measured current and to detect a fault when the temperature rise is greater than this predetermined temperature rise threshold.

It is stated herein that it is the electricity supplier (or the network manager) that causes the cutoff member to open on receiving a warning message or an alarm message. Nevertheless, provision may be made for the meter itself to decide to open the cutoff member as a function of the measured electric current and temperatures. Under such circumstances, provision may be made either for the meter to act independently and take a decision to open the cutoff member, or else for the meter to be required to send a request and receive authorization (from the electricity supplier or from the network manager) in order to cause the cutoff member to open, or else for the meter to be preprogrammed (by the electricity supplier or by the network manager) so as to authorize opening of the cutoff member without sending a request.

Finally, with a polyphase meter, the method of the invention is applicable to each phase, and when a fault is detected on one of the phases, the decision to open the cutoff member applies to said phase.

In a variant, it is possible to decide to open the cutoff members of all of the phases as soon as a fault leading to a decision to open the cutoff member is detected on at least one of the phases.

The invention claimed is:

1. A detection method for detecting a fault in an electricity meter that includes a cutoff member, the fault producing an abnormal rise of temperature inside the electricity meter, the detection method comprising the steps of:
   measuring the magnitude of an electric current flowing through the cutoff member;
   measuring an inside temperature of the electricity meter in the proximity of the cutoff member;
   acquiring a first inside temperature, inside the electricity meter in the proximity of the cutoff member, when the measured current is at a first plateau at a first current;
   acquiring a second inside temperature, inside the electricity meter in the proximity of the cutoff member, when the measured current is at a second plateau at a second current; and
   detecting the presence or the absence of a fault on the basis of the ratio of the difference between the second temperature and the first temperature divided by the difference between the second current and the first current.

2. The detection method according to claim 1, wherein the difference between the second current and the first current needs to be greater than or equal in absolute value to a predetermined current difference threshold in order for the first current and the second current to be taken into account for performing the detection method.

3. The detection method according to claim 2, wherein the predetermined current difference threshold lies in the range 5 A to 15 A.

4. The detection method according to claim 1, wherein the first current and/or the second current needs to be greater than or equal to a predetermined current threshold for the first current and the second current to be taken into account for performing the method of the invention.

5. The detection method according to claim 4, wherein the predetermined current threshold lies in the range 1 A to 10 A.

6. The detection method according to claim 1, wherein a maximum difference in absolute value between a current at any instant during the first plateau and the first current must be less than or equal to a first predetermined plateau threshold, and the maximum difference in absolute value between a current at any instant during the second plateau and the second current must be less than or equal to a second predetermined plateau threshold, in order for the first plateau and the second plateau to be taken into account for performing the detection method.

7. The detection method according to claim 6, wherein the first predetermined plateau threshold lies in the range 5% to 25% of the first current, and the second predetermined plateau threshold lies in the range 5% to 25% of the second current.

8. The detection method according to claim 1, wherein a fault is detected when the ratio is greater than or equal to a predetermined fault threshold.

9. The detection method according to claim 8, wherein the predetermined fault threshold lies in the range 0.2° C./A to 0.8° C./A.

10. The detection method according to claim 1, wherein a potential fault is detected when the ratio is greater than or equal to a potential fault threshold, and wherein a confirmed fault is detected when the ratio is greater than or equal to a confirmed fault threshold.

11. The detection method according to claim 10, comprising the steps of:
   sending a warning message when a potential fault is detected; and
   sending an alarm message when a confirmed fault is detected.

12. The detection method according to claim 1, wherein the cutoff member is caused to open when a fault is detected.

13. The detection method according to claim 1, including a step that consists in filtering the measured current between the first plateau and the second plateau, a first lowpass filter presenting a first cutoff frequency being used if the second current is greater than the first current, and a second lowpass filter presenting a second cutoff frequency greater than the first cutoff frequency being used if the second current is less than the first current.

14. The detection method according to claim 1, further comprising the steps of:
   measuring the temperature outside the electricity meter;
   calculating a temperature rise equal to the difference between the inside temperature and the outside temperature; and
   detecting a fault when the temperature rise is greater than a predetermined temperature rise threshold that depends on the measured current.

15. The detection method according to claim 14, further comprising the step of storing a table in a memory of the electricity meter, the table comprising current values, and for each current value, an expected temperature rise value and a predetermined temperature rise threshold.

16. The detection method according to claim 15, wherein, for each current value, the table comprises an expected temperature rise value, a temperature rise threshold representative of a potential fault, and a temperature rise value representative of a confirmed fault.

17. The detection method according to claim 16, comprising the steps of:
   sending a warning message when a potential fault is detected; and
   sending an alarm message when a confirmed fault is detected.

18. An electricity meter including a cutoff member, a current sensor for measuring an electric current flowing through the cutoff member when it is closed, an inside temperature sensor positioned in the proximity of the cutoff member, and processor means arranged to perform the detection method according to claim 1.

19. A computer program comprising instructions enabling an electricity meter to perform the detection method according to claim 1.

20. A storage means, wherein they store a computer program comprising instructions enabling an electricity meter to perform the detection method according to claim 1.

* * * * *